(12) United States Patent
Chang et al.

(10) Patent No.: US 8,884,642 B2
(45) Date of Patent: Nov. 11, 2014

(54) CIRCUIT HAVING AN EXTERNAL TEST VOLTAGE

(75) Inventors: Yen-An Chang, Miaoli County (TW); Po-Ching Wu, New Taipei (TW)

(73) Assignee: Etron Technology, Inc., Hsinchu (TW)

( * ) Notice: Subject to any disclaimer, the term of this patent is extended or adjusted under 35 U.S.C. 154(b) by 212 days.

(21) Appl. No.: 13/342,207

(22) Filed: Jan. 3, 2012

(65) Prior Publication Data

US 2012/0206161 A1 Aug. 16, 2012

(30) Foreign Application Priority Data

Feb. 11, 2011 (TW) .............................. 100104638 A

(51) Int. Cl.
*G01R 31/02* (2006.01)
*G01R 31/26* (2014.01)
*G01R 35/00* (2006.01)
*G11C 29/12* (2006.01)
*G11C 29/48* (2006.01)

(52) U.S. Cl.
CPC ........ *G01R 35/007* (2013.01); *G11C 29/12005* (2013.01); *G11C 29/1201* (2013.01); *G11C 29/48* (2013.01)
USPC ................. 324/762.09; 324/537; 324/764.01; 323/313

(58) Field of Classification Search
USPC ................. 324/762.09, 537, 764.01; 323/313
See application file for complete search history.

(56) References Cited

U.S. PATENT DOCUMENTS

| 3,699,358 | A | * | 10/1972 | Wilkinson | 327/405 |
| 5,012,178 | A | * | 4/1991 | Weiss et al. | 323/269 |
| 6,011,428 | A | * | 1/2000 | Tsukude et al. | 327/541 |
| 6,084,790 | A | * | 7/2000 | Wong | 363/71 |
| 6,563,293 | B2 | * | 5/2003 | Marino et al. | 323/272 |
| 6,949,971 | B2 | * | 9/2005 | Jang | 327/541 |
| 7,215,183 | B2 | * | 5/2007 | Nakada | 327/539 |
| 7,348,834 | B2 | * | 3/2008 | Itoh | 327/539 |
| 2002/0180453 | A1 | * | 12/2002 | Itoh | 324/525 |
| 2006/0238477 | A1 | * | 10/2006 | Lew et al. | 345/94 |
| 2009/0174392 | A1 | * | 7/2009 | Kadner | 324/76.11 |

* cited by examiner

*Primary Examiner* — Tung X Nguyen
*Assistant Examiner* — Giovanni Astacio-Oquendo
(74) *Attorney, Agent, or Firm* — Winston Hsu; Scott Margo

(57) ABSTRACT

A circuit having an external test voltage includes an amplifier, a first P-type metal-oxide-semiconductor transistor, a second P-type metal-oxide-semiconductor transistor, at least one reference resistor, at least one test resistor, a first upper resistor, a second upper resistor and a lower resistor. The second P-type metal-oxide-semiconductor transistor is the same as the first P-type metal-oxide-semiconductor transistor. A difference between a voltage of a test output terminal of each test resistor and a voltage of a reference output terminal of a corresponding reference resistor is kept at a predetermined value by duplicating a current flowing through the first P-type metal-oxide-semiconductor transistor to the second P-type metal-oxide-semiconductor transistor, and feeding an external test voltage to a second terminal of the second upper resistor.

8 Claims, 7 Drawing Sheets

| 5183/5203 | 5182/5202 | 5181/5201 | VINTREFN/VINTREFT |
|---|---|---|---|
| Turned off | Turned off | Turned on | VNI/VT1 |
| Turned off | Turned on | Turned on or turned off | VNI−△V2/VT1−△V2 |
| Turned on | Turned on or turned off | Turned on or turned off | VNI−(△V2+△V3)/VT1−(△V2+△V3) |
| Turned off | Turned off | Turned off | VNI+△V1/VT1+△V1 |

CIRCUIT HAVING AN EXTERNAL TEST VOLTAGE

BACKGROUND OF THE INVENTION

1. Field of the Invention

The present invention is related to a circuit having an external test voltage, and particularly to a circuit having an external test that only has one pad for inputting an external test voltage, and outputs test voltages not varying with the external test voltage in a geometric series.

2. Description of the Prior Art

Please refer to FIG. 1. FIG. 1 is a diagram illustrating a circuit 100 having an external test voltage according to the prior art. The circuit 100 includes an amplifier 102, a P-type metal-oxide-semiconductor transistor 104, a reference switch 106, a test switch 108, a resistor RU, a resistor RD, and a plurality of series resistors R1 to Rn. When the circuit 100 operates normally, the reference switch 106 is turned on and the test switch 108 is turned off. Meanwhile, a reference voltage VREF is inputted to a negative input terminal of the amplifier 102 through the reference switch 106, and a voltage of a node A is also the reference voltage VREF. Therefore, voltages outputted by reference output terminals VINTREFN1, VINTREFN2, VINTREFN3, . . . , VINTREFNn are proportional to the reference voltage VREF. When an external test voltage VT is inputted to the circuit 100, the reference switch 106 is turned off and the test switch 108 is turned on. Meanwhile, the external test voltage VT is inputted to the negative input terminal of the amplifier 102 through the test switch 108, and a voltage of the node A is the external test voltage VT. Therefore, voltages outputted by the reference output terminals VINTREFN1, VINTREFN2, VINTREFN3 . . . , VINTREFNn are proportional to the external test voltage VT.

However, in the circuit 100, voltages outputted by the reference output terminals VINTREFN1, VINTREFN2, VINTREFN3, . . . , VINTREFNn vary with the reference voltage VREF in a geometric series. Therefore, voltages outputted by some reference output terminals may be high enough to damage tested circuits.

Please refer to FIG. 2. FIG. 2 is a diagram illustrating a circuit 200 having external test voltages according to the prior art. The circuit 200 includes an amplifier 202, a P-type metal-oxide-semiconductor transistor 204, a plurality of reference switches 2061 to 206n, a plurality of test switches 2081 to 208n, a resistor RU, a resistor RD, and a plurality of series resistors R1 to Rn. As shown in FIG. 2, the reference switch 2061 is coupled between a reference output terminal VINTREFN1 and a reference voltage output terminal VINTREF1, and the test switch 2081 is coupled between the reference voltage output terminal VINTREF1 and a test output terminal VINTREFT1. The reference switch 2062 is coupled between a reference output terminal VINTREFN2 and a reference voltage output terminal VINTREF2, and the test switch 2082 is coupled between reference voltage output terminal VINTREF2 and a test output terminal VINTREFT2, and so on.

Therefore, when each reference voltage output terminal of the reference voltage output terminals VINTREF1, VINTREF2, VINTREF3 . . . , VINTREFn needs to output an external test voltage, a corresponding reference switch is turned off and a corresponding test switch is turned on. In addition, when each reference voltage output terminal of the reference voltage output terminals VINTREF1, VINTREF2, VINTREF3 . . . , VINTREFn needs to output a reference output voltage, a corresponding reference switch is turned on and a corresponding test switch is turned off. For example, if the reference voltage output terminal VINTREF1 needs to output an external test voltage V1, the reference switch 2061 is turned off and the test switch 2081 is turned on. Therefore, the external test voltage V1 is outputted by the reference voltage output terminal VINTREF1 through the test switch 2081. Further, subsequent operational principles of the reference voltage output terminals VINTREF2 to VINTREFn are the same as those of the reference voltage output terminal VINTREF1, so further description thereof is omitted for simplicity.

Though the circuit 200 improves a disadvantage of output voltages of the reference output terminals VINTREFN1, VINTREFN2, VINTREFN3 . . . , VINTREFNn varying with the reference voltage VREF, the circuit 200 needs a plurality of pads for inputting the external test voltage during a chip test. Therefore, the circuit 200 may not be realized in a small area chip.

SUMMARY OF THE INVENTION

An embodiment provides a circuit having an external test voltage. The circuit includes an amplifier, a first P-type metal-oxide-semiconductor transistor, a second P-type metal-oxide-semiconductor transistor, at least one reference resistor, at least one test resistor, a first upper resistor, a second upper resistor, a lower resistor, and a test switch. The amplifier has a first input terminal for receiving a first voltage, a second input terminal for receiving a reference voltage, a third input terminal, and an output terminal. The first P-type metal-oxide-semiconductor transistor has a first terminal for receiving the first voltage, a second terminal coupled to the output terminal of the amplifier, and a third terminal. The second P-type metal-oxide-semiconductor transistor has a first terminal for receiving the first voltage, a second terminal coupled to the output terminal of the amplifier, and a third terminal. The at least one reference resistor has a first terminal coupled to the third terminal of the first P-type metal-oxide-semiconductor transistor, and a second terminal, where each reference resistor has a reference output terminal. The at least one test resistor has a first terminal coupled to the third terminal of the second P-type metal-oxide-semiconductor transistor, and a second terminal, where each test resistor has a test output terminal, and a value of the test resistor is the same as a value of a corresponding reference resistor. The first upper resistor has a first terminal coupled to the second terminal of the at least one reference resistor, and a second terminal coupled to the third input terminal of the amplifier. The second upper resistor has a first terminal coupled to the second terminal of the at least one test resistor, and a second terminal for receiving the external test voltage. The lower resistor has a first terminal coupled to the third input terminal of the amplifier, and a second terminal coupled to ground, where the second P-type metal-oxide-semiconductor transistor is the same as the first P-type metal-oxide-semiconductor transistor.

The present invention provides a circuit having an external test voltage. The circuit utilizes a second P-type metal-oxide-semiconductor transistor to replicate current flowing through a first P-type metal-oxide-semiconductor transistor, and feeds the external test voltage from a second terminal of a second upper resistor. Thus, a difference between a voltage of a test output terminal of each test resistor and a voltage of a reference output terminal of a corresponding reference resistor is a predetermined value. Compared to the prior art, the present invention can also improve disadvantages of the voltage of the reference output terminal varying with a reference voltage in a geometric series, and needing a plurality of pads for inputting the external test voltage. In addition, the present invention can store fuse-programming voltage information during a chip test period.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram illustrating a look-up table of a reference voltage output terminal adjusted according to the three first reference switches and the three first test switches.

DETAILED DESCRIPTION

Figure 1:
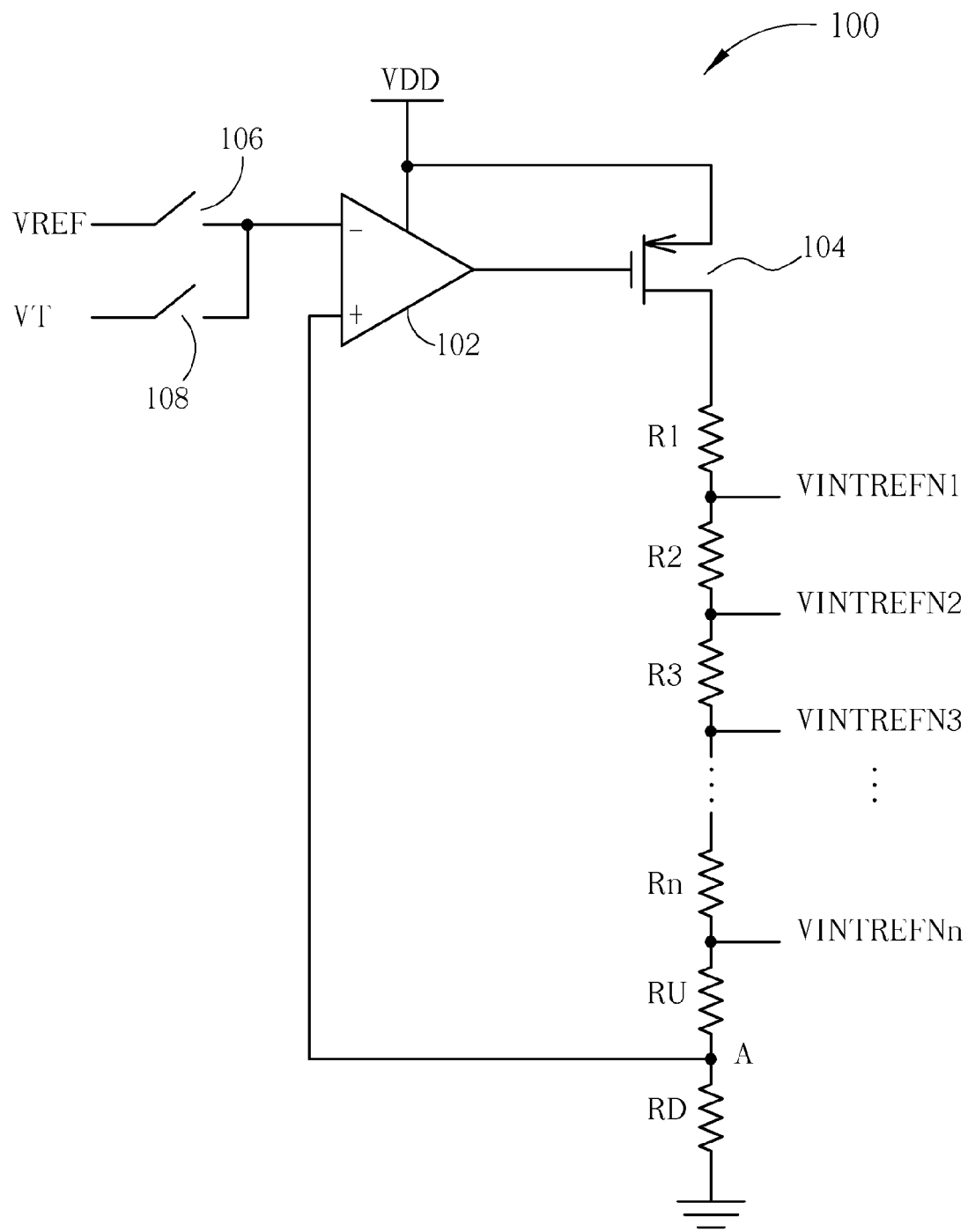
FIG. 1 is a diagram illustrating a circuit having an external test voltage according to the prior art.
Figure 2:
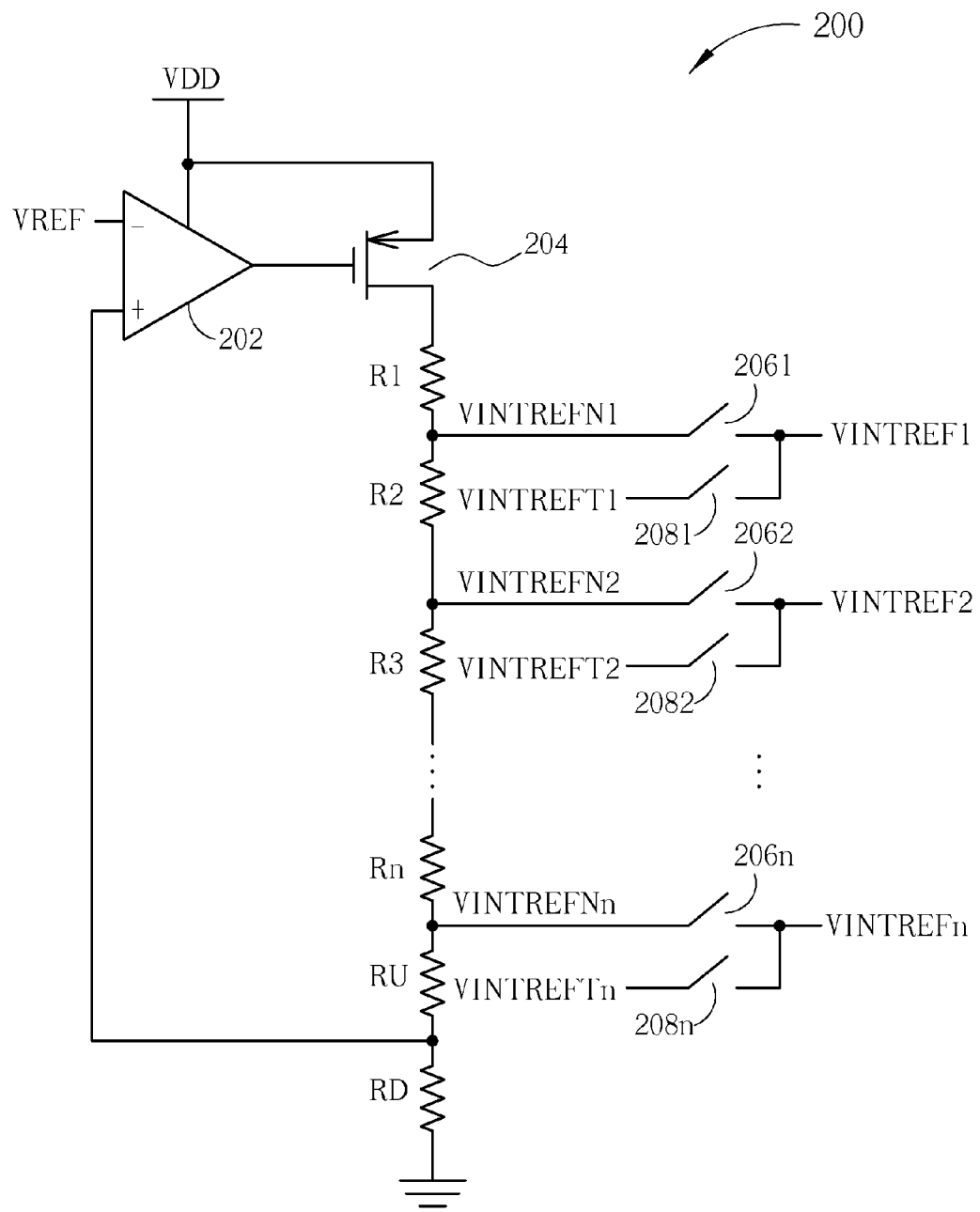
FIG. 2 is a diagram illustrating a circuit having external test voltages according to the prior art.
Figure 3:
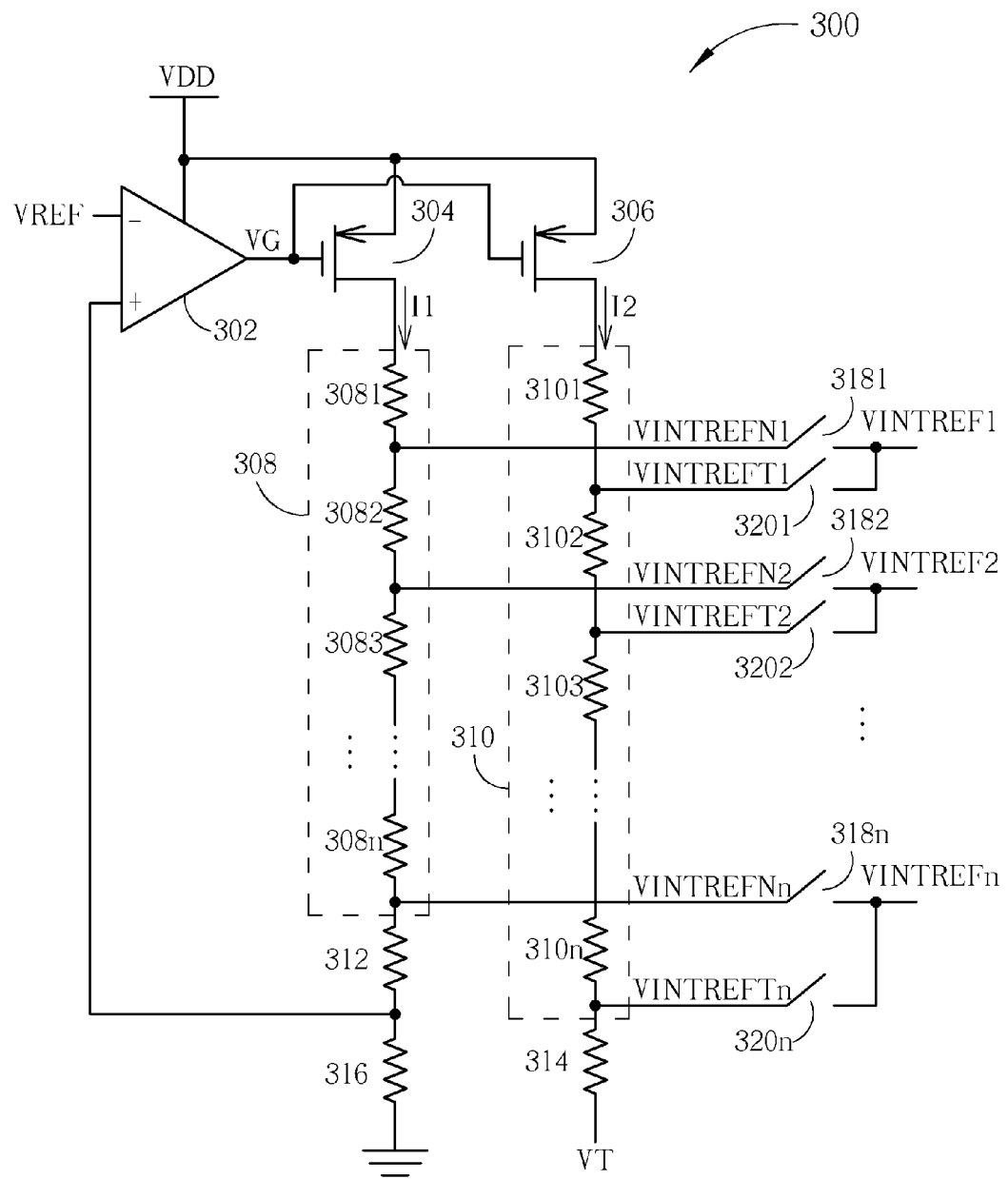
FIG. 3 is a diagram illustrating a circuit having an external test voltage according to an embodiment.

Please refer to FIG. 3. FIG. 3 is a diagram illustrating a circuit 300 having an external test voltage according to an embodiment. The circuit 300 includes an amplifier 302, a first P-type metal-oxide-semiconductor transistor 304, a second P-type metal-oxide-semiconductor transistor 306, at least one reference resistor 308, at least one test resistor 310, a first upper resistor 312, a second upper resistor 314, and a lower resistor 316, where the second P-type metal-oxide-semiconductor transistor 306 is the same as the first P-type metal-oxide-semiconductor transistor 304. The amplifier 302 has a first input terminal for receiving a first voltage VDD, a second input terminal for receiving a reference voltage VREF, a third input terminal, and an output terminal for outputting a control voltage VG. The first P-type metal-oxide-semiconductor transistor 304 has a first terminal for receiving the first voltage VDD, a second terminal coupled to the output terminal of the amplifier 302 for receiving the control voltage VG, and a third terminal. The second P-type metal-oxide-semiconductor transistor 306 has a first terminal for receiving the first voltage VDD, a second terminal coupled to the output terminal of the amplifier 302 for receiving the control voltage VG, and a third terminal. The at least one reference resistor 308 has a first terminal coupled to the third terminal of the first P-type metal-oxide-semiconductor transistor 304, and a second terminal. The at least one reference resistor 308 includes reference resistors 3081 to 308n, where n≥1 and each reference resistor has a corresponding reference output terminal. For example, a reference resistor 3081 has a corresponding reference output terminal VINTREFN1 and a reference resistor 3082 has a corresponding reference output terminal VINTREFN2. The at least one test resistor 310 has a first terminal coupled to the third terminal of the second P-type metal-oxide-semiconductor transistor 306, and a second terminal. The at least one test resistor 310 includes test resistors 3101 to 310n, where n≥1 and each test resistor has a corresponding test output terminal. For example, a test resistor 3101 has a corresponding test output terminal VINTREFT1 and a test resistor 3102 has a corresponding test output terminal VINTREFT2. In addition, a resistance of each test resistor is the same as a resistance of each reference resistor. The first upper resistor 312 has a first terminal coupled to the second terminal of the at least one reference resistor 308, and a second terminal coupled to the third input terminal of the amplifier 302, where a resistance of the first upper resistor 312 can be zero. The second upper resistor 314 has a first terminal coupled to the second terminal of the at least one test resistor 310, and a second terminal for receiving an external test voltage VT, where a resistance of the second upper resistor 314 can be zero. The lower resistor 316 has a first terminal coupled to the third input terminal of the amplifier 302, and a second terminal coupled to ground.

In addition, the circuit 300 further includes at least one reference switch 3181 to 318n and at least one test switch 3201 to 320n, where n≥1. Each reference switch has a first terminal coupled to a corresponding reference output terminal, and a second terminal coupled to a corresponding reference voltage output terminal. Each test switch has a first terminal coupled to a corresponding test output terminal, and a second terminal coupled to a corresponding reference voltage output terminal. For example, a reference switch 3181 has a first terminal coupled to a reference output terminal VINTREFN1, and a second terminal coupled to a reference voltage output terminal VINTREF1. Similarly, a test switch 3201 has a first terminal coupled to a test output terminal VINTREFT1, and a second terminal coupled to the reference voltage output terminal VINTREF1.

As shown in FIG. 3, the second P-type metal-oxide-semiconductor transistor 306 is the same as the first P-type metal-oxide-semiconductor transistor 304, so current I2 flowing through the at least one test resistor 310 is equal to current I1 flowing through the at least one reference resistor 308. If a relationship between the external test voltage VT and the reference voltage VREF is as shown in equation (1), a relationship between a voltage VNi of a reference output terminal VINTREFNi and a voltage VTi of a test output terminal VINTREFTi can be determined by equation (2), where 1≤i≤n:

$$VT = VREF \pm \Delta V \quad (1)$$

$$VTi = VNi \pm \Delta V \quad (2)$$

When the circuit 300 is in a non-chip test period, at least one reference switch is turned on, so a corresponding reference voltage output terminal outputs a voltage of a corresponding reference output terminal. When the circuit 300 is in a chip test period, at least one test switch is turned on, so a corresponding reference voltage output terminal outputs a voltage of a corresponding test output terminal. For example, when the circuit 300 is in the non-chip test period, the reference switch 3181 is turned on, so the reference voltage output terminal VINTREF1 outputs a voltage VN1 of the reference output terminal VINTREFN1. When the circuit 300 is in the chip test period, the test switch 3201 is turned on, so the reference voltage output terminal VINTREF1 outputs a voltage VT1 of the test output terminal VINTREFT1.

Figure 4:
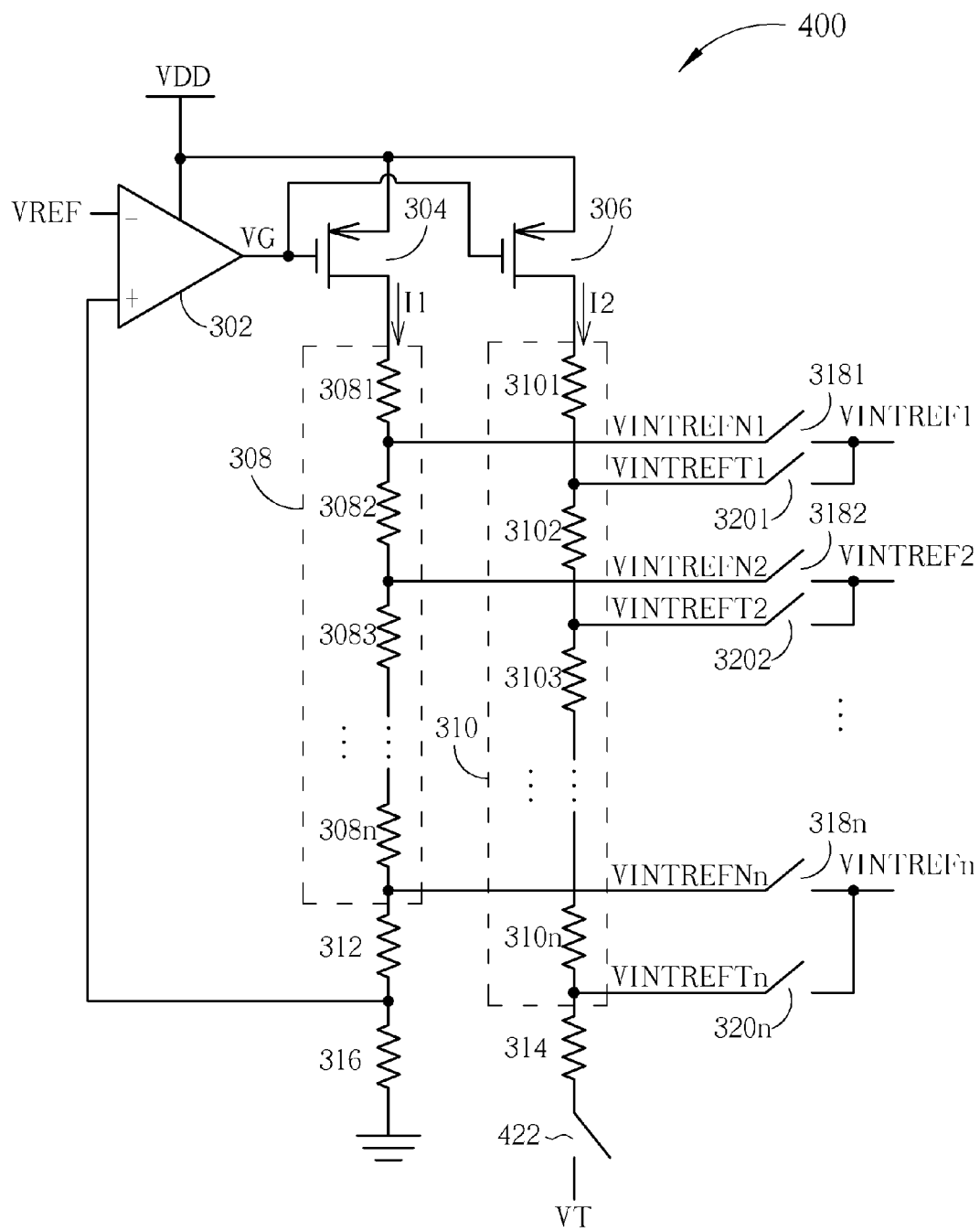
FIG. 4 is a diagram illustrating a circuit having an external test voltage according to another embodiment.

Please refer to FIG. 4. FIG. 4 is a diagram illustrating a circuit 400 having an external test voltage according to another embodiment. A difference between the circuit 400 and the circuit 300 is that the circuit 400 further includes a power saving switch 422. The power saving switch 422 has a first terminal coupled to the second terminal of the second upper resistor 314, and a second terminal for receiving the external test voltage VT. The power saving switch 422 is only turned on during the chip test period. Therefore, the circuit 400 can save power consumption during the non-chip test period. Further, subsequent operational principles of the circuit 400 are the same as those of the circuit 300, so further description thereof is omitted for simplicity.

Figure 5:
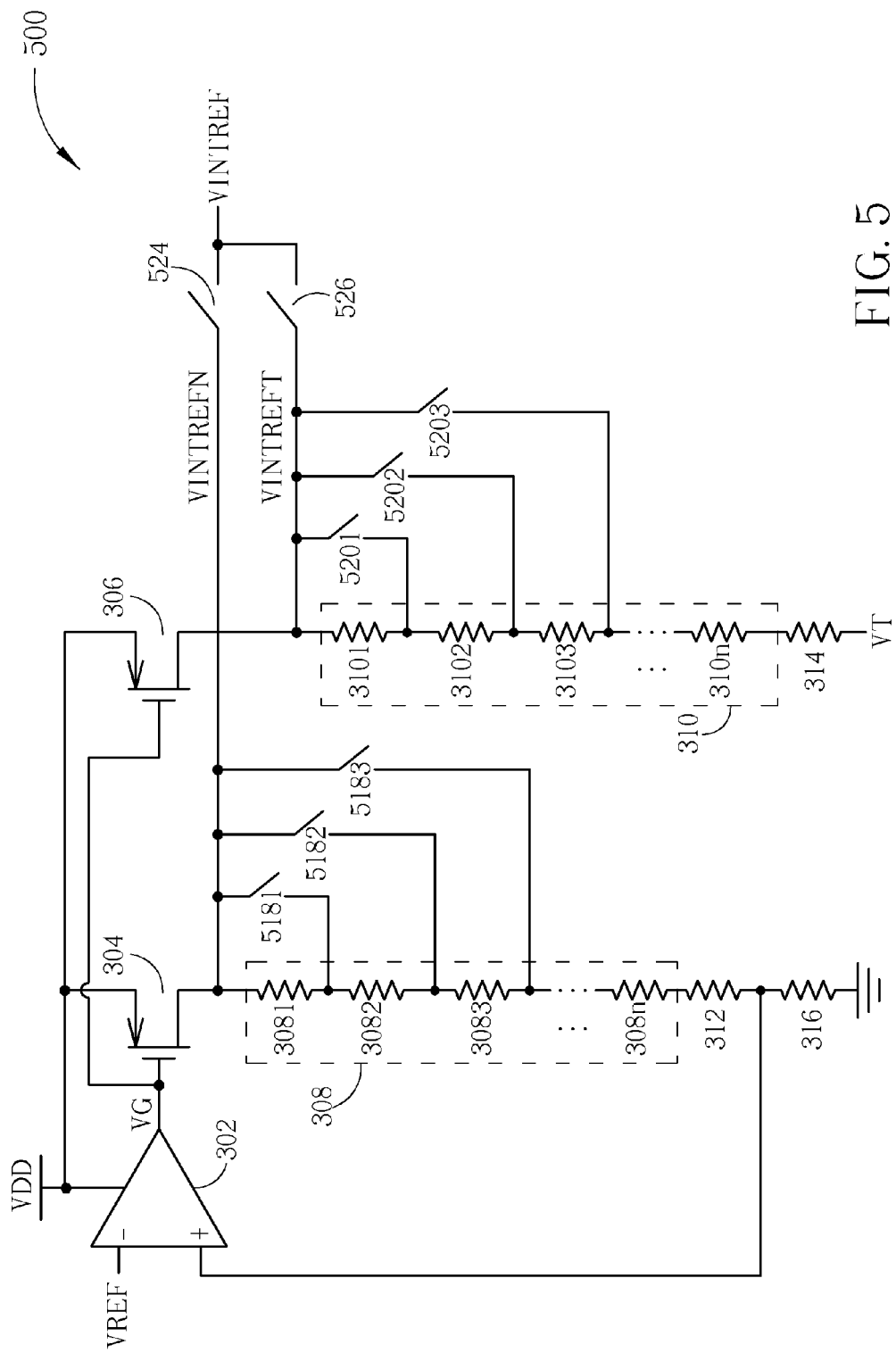
FIG. 5 is a diagram illustrating a circuit having an external test voltage according to another embodiment.

Please refer to FIG. 5. FIG. 5 is a diagram illustrating a circuit 500 having an external test voltage according to another embodiment. A difference between the circuit 500 and the circuit 300 is that the circuit 500 does not includes the at least one reference switch 318 and the at least one test switch 320, and instead further includes three first reference switches 5181, 5182, 5183, three first test switches 5201, 5202, 5203, a second reference switch 524, and a second test switch 526. Each first reference switch has a first terminal coupled to the third terminal of the first P-type metal-oxide-semiconductor transistor 304 (that is, a reference output terminal VINTREFN), and a second terminal coupled to a second terminal of a corresponding reference resistor. Each first test switch has a first terminal coupled to the third terminal of the second P-type metal-oxide-semiconductor transistor 306 (that is, a test output terminal VINTREFT), and a second terminal coupled to a second terminal of a corresponding test resistor. For example, the first reference switch 5181 has a first terminal coupled to the third terminal of the first P-type metal-oxide-semiconductor transistor 304, and a second terminal coupled to a second terminal of the reference resistor 3081. The first reference switch 5182 has a first terminal coupled to the third terminal of the first P-type metal-oxide-semiconductor transistor 304, and a second terminal coupled to a second terminal of the reference resistor 3082. The first test switch 5201 has a first terminal coupled to the third terminal of the second P-type metal-oxide-semiconductor transistor 306, and a second terminal coupled to a second terminal of the test resistor 3101. The first test switch 5202 has a first terminal coupled to the third terminal of the second P-type metal-oxide-semiconductor transistor 306, and a second terminal coupled to a second terminal of the test resistor 3102. But, the present invention is not limited to the three first reference switches and the three first test switches.

The circuit 500 can store fuse-programming voltage information during the chip test period. Please refer to FIG. 6. FIG. 6 is a diagram illustrating a look-up table of a reference voltage output terminal VINTREF adjusted according to the three first reference switches 5181, 5182, 5183 and the three first test switches 5201, 5202, 5203. As shown in FIG. 5 and FIG. 6, when the first reference switches 5182, 5183 and the first test switches 5202, 5203 are turned off, and the first reference switch 5181 and the first test switch 5201 are turned on, a voltage VN1 of the reference output terminal VINTREFN and a voltage VT1 of the test output terminal VINTREFT are set to be predetermined values. Meanwhile, the reference voltage output terminal VINTREF can output the voltage VN1 or the voltage VT1 through turning-on of the second reference switch 524 or turning-on of the second test switch 526. When the first reference switch 5181 and the first test switch 5201 are turned on or turned off, the first reference switch 5182 and the first test switch 5202 are turned on, and the first reference switch 5183 and the first test switch 5203 are turned off, the reference voltage output terminal VINTREF can output a voltage VN2 or a voltage VT2 through the turning-on of the second reference switch 524 or the turning-on of the second test switch 526. That is to say, the voltage VN2 or the voltage VT2 of the reference voltage output terminal VINTREF is lower than the predetermined value, and a difference between the voltage VN2 and the voltage VN1 or a difference between the voltage VT2 and the voltage VT1 is $-\Delta V2$ ($\Delta V2$ is a voltage drop of the reference resistor 3082 and a voltage drop of the test resistor 3102). When the first reference switches 5181, 5182 and the first test switches 5201, 5202 are turned on or turned off, and the first reference switch 5183 and the first test switch 5203 are turned on, the reference voltage output terminal VINTREF can output a voltage VN3 or a voltage VT3 through the turning-on of the second reference switch 524 or the turning-on of the second test switch 526. That is to say, the voltage VN3 or the voltage VT3 of the reference voltage output terminal VINTREF is lower than the predetermined value, and a difference between the voltage VN3 and the voltage VN1 or a difference between the voltage VT3 and the voltage VT1 is $-(\Delta V2+\Delta V3)$ ($\Delta V3$ is a voltage drop of the reference resistor 3083 and a voltage drop of the test resistor 3103). When the first reference switches 5181, 5182, 5183 and the first test switches 5201, 5202, 5203 are turned off, the reference voltage output terminal VINTREF can output a voltage VN0 or a voltage VT0 through the turning-on of the second reference switch 524 or the turning-on of the second test switch 526. That is to say, the voltage VN0 or the voltage VT0 of the reference voltage output terminal VINTREF is higher than the predetermined value, and a difference between the voltage VN0 and the voltage VN1 or a difference between the voltage VT0 and the voltage VT1 is $+\Delta V1$ ($\Delta V1$ is a voltage drop of the reference resistor 3081 and a voltage drop of the test resistor 3101).

Therefore, during the chip test period, the circuit 500 can utilize the first reference switches 5181, 5182, 5183 and the first test switches 5201, 5202, 5203 to adjust an output voltage of the reference voltage output terminal VINTREF upward or downward from the predetermined value.

Figure 7:
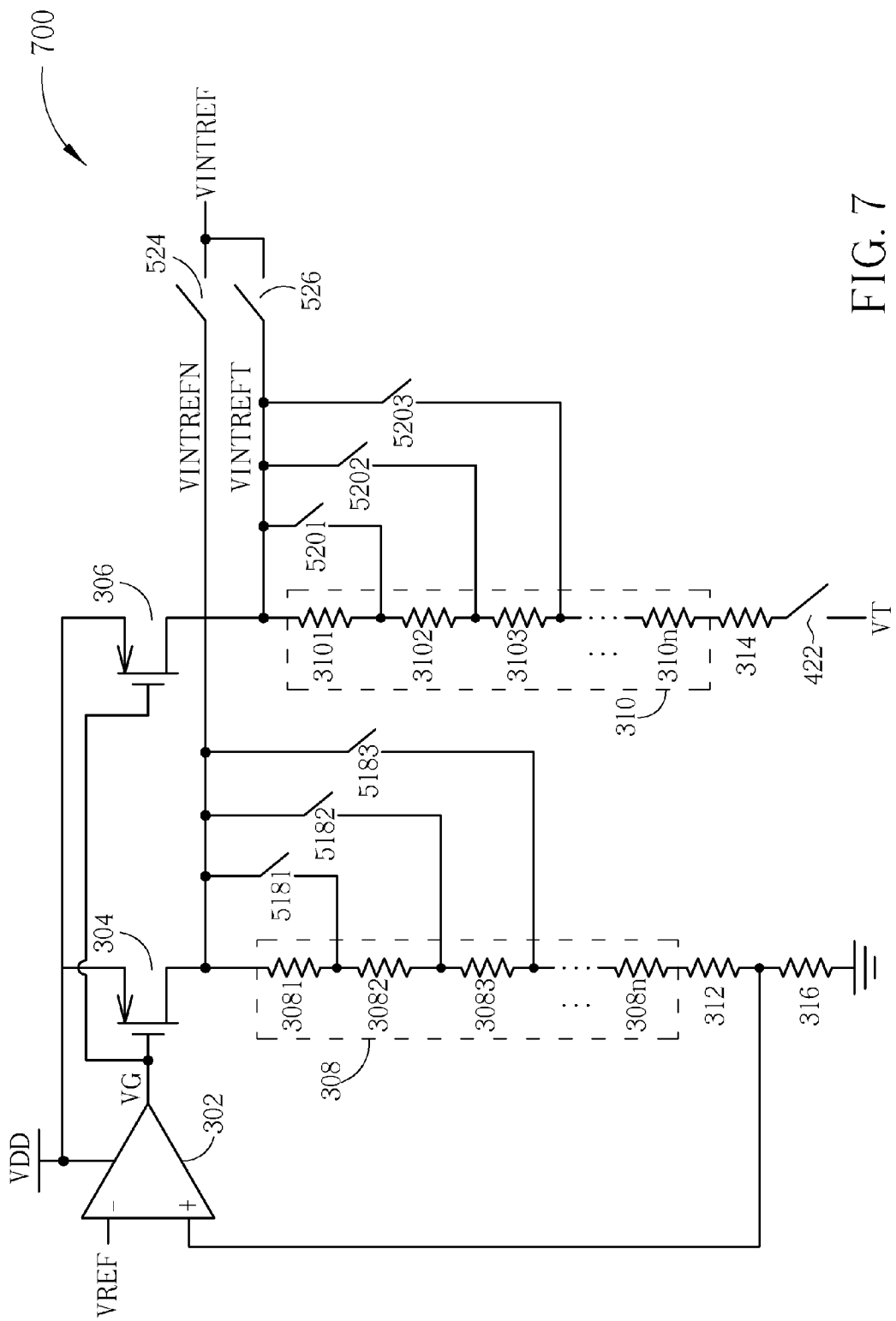
FIG. 7 is a diagram illustrating a circuit having an external test voltage according to another embodiment.

Please refer to FIG. 7. FIG. 7 is a diagram illustrating a circuit 700 having an external test voltage according to another embodiment. A difference between the circuit 700 and the circuit 500 is that the circuit 700 further includes a power saving switch 422. The power saving switch 422 has a first terminal coupled to the second terminal of the second upper resistor 314, and a second terminal for receiving the external test voltage VT. The power saving switch 422 is only turned on during the chip test period. Therefore, the circuit 700 can save power consumption during the non-chip test period. Further, subsequent operational principles of the circuit 700 are the same as those of the circuit 500, so further description thereof is omitted for simplicity.

To sum up, the circuit having the external test voltage utilizes the second P-type metal-oxide-semiconductor transistor to replicate the current flowing through the first P-type metal-oxide-semiconductor transistor, and feeds the external test voltage from the second terminal of the second upper resistor. Thus, a difference between a voltage of a test output terminal of each test resistor and a voltage of a reference output terminal of a corresponding reference resistor is a predetermined value. Compared to the prior art, the present invention can also improve disadvantages of the output voltage of the reference output terminal varying with the reference voltage in a geometric series, and needing a plurality of pads for inputting the external test voltage. In addition, the present invention can store the fuse-programming voltage information during the chip test period.

Those skilled in the art will readily observe that numerous modifications and alterations of the device and method may be made while retaining the teachings of the invention.

What is claimed is:
1. A circuit having an external test voltage, the circuit comprising:
  an amplifier having a first input terminal for receiving a first voltage, a second input terminal for receiving a reference voltage, a third input terminal, and an output terminal;

a first P-type metal-oxide-semiconductor transistor having a first terminal for receiving the first voltage, a second terminal coupled to the output terminal of the amplifier, and a third terminal;
a second P-type metal-oxide-semiconductor transistor having a first terminal for receiving the first voltage, a second terminal coupled to the output terminal of the amplifier, and a third terminal;
at least one reference resistor having a first terminal coupled to the third terminal of the first P-type metal-oxide-semiconductor transistor, and a second terminal, wherein each reference resistor has a reference output terminal;
at least one test resistor having a first terminal coupled to the third terminal of the second P-type metal-oxide-semiconductor transistor, and a second terminal, wherein each test resistor has a test output terminal, and a resistance of the test resistor is equal to a resistance of a corresponding reference resistor;
a first upper resistor having a first terminal coupled to the second terminal of the at least one reference resistor, and a second terminal coupled to the third input terminal of the amplifier;
a second upper resistor having a first terminal directly coupled to the second terminal of one of the at least one test resistor in series, and a second terminal for receiving the external test voltage, wherein a current flowing through the at least one test resistor is equal to a current flowing through the at least one reference resistor and a voltage of the test output terminal corresponds to the external test voltage and the reference voltage according to relationships of the current flowing through the at least one test resistor being equal to the current flowing through the at least one reference resistor, the resistance of the test resistor being equal to the resistance of the corresponding reference resistor when the circuit is in a chip test period, and the current flowing through the at least one test resistor flows through the second upper resistor; and
a lower resistor having a first terminal coupled to the third input terminal of the amplifier, and a second terminal coupled to ground.

2. The circuit of claim 1, wherein size of the second P-type metal-oxide-semiconductor transistor is equal to size of the first P-type metal-oxide-semiconductor transistor, wherein the second P-type metal-oxide-semiconductor transistor and the first P-type metal-oxide-semiconductor transistor are fabricated in a same metal-oxide-semiconductor process.

3. The circuit of claim 1, further comprising:
at least one reference switch, wherein each reference switch has a first terminal coupled to a corresponding reference output terminal, and a second terminal coupled to a corresponding reference voltage output terminal; and
at least one test switch, wherein each test switch has a first terminal coupled to a corresponding test output terminal, and a second terminal coupled to a corresponding reference voltage output terminal.

4. The circuit of claim 1, further comprising:
a power saving switch having a first terminal coupled to the second terminal of the second upper resistor, and a second terminal for receiving the external test voltage.

5. The circuit of claim 1, further comprising:
at least one first reference switch, wherein each first reference switch has a first terminal coupled to the third terminal of the first P-type metal-oxide-semiconductor transistor, and a second terminal coupled to a reference output terminal of a corresponding reference resistor; and
at least one first test switch, wherein each first test switch has a first terminal coupled to the third terminal of the second P-type metal-oxide-semiconductor transistor, and a second terminal coupled to a test output terminal of a corresponding test resistor.

6. The circuit of claim 5, further comprising:
a second reference switch having a first terminal coupled to the third terminal of the first P-type metal-oxide-semiconductor transistor, and a second terminal coupled to a reference voltage output terminal; and
a second test switch having a first terminal coupled to the third terminal of the second P-type metal-oxide-semiconductor transistor, and a second terminal coupled to the reference voltage output terminal.

7. The circuit of claim 5, further comprising:
a power saving switch having a first terminal coupled to the second terminal of the second upper resistor, and a second terminal for receiving the external test voltage.

8. A circuit having an external test voltage, the circuit comprising:
an amplifier having a first input terminal for receiving a first voltage, a second input terminal for receiving a reference voltage, a third input terminal, and an output terminal;
a first P-type metal-oxide-semiconductor transistor having a first terminal for receiving the first voltage, a second terminal coupled to the output terminal of the amplifier, and a third terminal;
a second P-type metal-oxide-semiconductor transistor having a first terminal for receiving the first voltage, a second terminal coupled to the output terminal of the amplifier, and a third terminal;
at least one reference resistor having a first terminal coupled to the third terminal of the first P-type metal-oxide-semiconductor transistor, and a second terminal, wherein each reference resistor has a reference output terminal;
at least one test resistor having a first terminal coupled to the third terminal of the second P-type metal-oxide-semiconductor transistor, and a second terminal, wherein each test resistor has a test output terminal, and a value of the each test resistor is the same as a value of a corresponding reference resistor;
a first upper resistor having a first terminal coupled to the second terminal of the at least one reference resistor, and a second terminal coupled to the third input terminal of the amplifier;
a second upper resistor having a first terminal coupled to the second terminal of the at least one test resistor, and a second terminal for receiving the external test voltage; and
a lower resistor having a first terminal coupled to the third input terminal of the amplifier, and a second terminal coupled to ground;
wherein the second P-type metal-oxide-semiconductor transistor is used for replicating a current flowing through the first P-type metal-oxide-semiconductor transistor, and the external test voltage received by the second upper resistor to let a difference between a voltage of the test output terminal of the each test resistor and a voltage of a reference output terminal of the corresponding reference resistor be a predetermined value.

* * * * *